(12) United States Patent
Boyd

(10) Patent No.: US 6,362,559 B1
(45) Date of Patent: Mar. 26, 2002

(54) PIEZOELECTRIC TRANSFORMER WITH SEGMENTED ELECTRODES

(75) Inventor: Clark Davis Boyd, Hampton, VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/503,106

(22) Filed: Feb. 11, 2000

Related U.S. Application Data

(60) Provisional application No. 60/119,810, filed on Feb. 12, 1999.

(51) Int. Cl.[7] .............................................. H01L 41/04
(52) U.S. Cl. ....................................... 310/359; 310/369
(58) Field of Search ................................ 310/359, 358, 310/369

(56) References Cited

U.S. PATENT DOCUMENTS

| | | | | |
|---|---|---|---|---|
| 2,830,274 A | * | 4/1958 | Rosen et al. ................. | 310/358 |
| 2,875,355 A | * | 2/1959 | Petermann ................... | 310/359 |
| 2,953,755 A | * | 9/1960 | Mattiat ........................ | 310/359 |
| 2,974,296 A | * | 3/1961 | Rosen ......................... | 310/359 |
| 2,975,354 A | * | 3/1961 | Rosen ......................... | 310/359 |
| 2,976,501 A | * | 3/1961 | Mattiat ........................ | 310/359 |
| 3,018,451 A | * | 1/1962 | Mattiat ........................ | 310/359 |
| 3,610,969 A | * | 10/1971 | Clawson et al. ............. | 310/314 |
| 3,764,848 A | * | 10/1973 | Berlincourt ................... | 315/55 |
| 5,168,253 A | * | 12/1992 | Nakagawa et al. .......... | 333/189 |
| 5,278,471 A | * | 1/1994 | Uehara et al. ............... | 310/366 |
| 5,371,430 A | * | 12/1994 | Sato et al. ................... | 310/359 |
| 5,814,922 A | * | 9/1998 | Uchino et al. ............... | 310/359 |
| 6,040,654 A | * | 3/2000 | Le Letty ...................... | 310/366 |

* cited by examiner

Primary Examiner—Nestor Ramirez
Assistant Examiner—Peter Medley
(74) Attorney, Agent, or Firm—Stephen E. Clark; David J. Bolduc

(57) ABSTRACT

A piezoelectric transformer is provided having segmented electrodes on one or both faces of a piezoelectric ceramic disk. Application of a voltage sequentially to one or more adjacent segments forms a travelling wave in the disk. Application of a voltage to alternate segments forms a resonant standing wave in the disk. The transformer may be configured with a resonant feedback circuit that provides step up voltage transformation, and may provide voltage to multiple loads.

14 Claims, 7 Drawing Sheets

PIEZOELECTRIC TRANSFORMER WITH SEGMENTED ELECTRODES

This appln claims benefit of Prov. No. 60/119,810 filed Feb. 12, 1999.

BACKGROUND OF THE INVENTION

1. Field of Invention

The present invention relates to piezoelectric transformers. More particularly, the present invention relates to a piezoelectric transformer having segmented electrodes on one or both faces of a piezoelectric ceramic disk. The transformer may be configured with a resonant feedback circuit that provides step up voltage transformation, and may provide voltage to multiple loads.

2. Description of the Prior Art

Wound-type electromagnetic transformers have been used for raising or lowering input voltages (step-up and step-down transformation, respectively) in internal power circuits of devices such as televisions or in charging devices of copier machines which require high voltage. Such electromagnetic transformers take the form of a conductor wound onto a core made of a magnetic substance. Because a large number of turns of the conductor are required to realize high transformation ratios, electromagnetic transformers that are effective, yet at the same time compact and slim in shape are extremely difficult to produce.

To remedy this problem, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

The ceramic body employed in prior piezoelectric transformers takes various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art as illustrated in FIGS. 2 and 3 which show disk-shaped and annular Rosen-type piezoelectric transformers, respectively. The typical Rosen-type piezoelectric transformer comprises a flat ceramic slab 110 which is appreciably longer than it is wide and substantially wider than thick. As shown in FIGS. 1 and 3, a piezoelectric body 110 is employed having some portions polarized differently from others. In the case of the prior art transformer illustrated in FIG. 1, the piezoelectric body 110 is in the form of a flat slab which is considerably wider than it is thick, and having greater length than width. A substantial portion of the slab 110 the portion 112 to the right of the center of the slab, is polarized longitudinally, whereas the remainder of the slab is polarized transversely to the plane of the face of the slab. In this case, the remainder of the slab is actually divided into two portions; one portion 114 being polarized transversely in one direction, and the remainder of the left half of the slab, the portion 116 also being polarized transversely but in the direction opposite to the direction of polarization in the portion 114. In the annular Rosen type transformer of FIG. 3, some portions of the annulus are polarized in the thickness direction, and the remaining portions are polarized in a circumference direction.

In order that electrical voltages may be related to mechanical stress in the slab 110, electrodes are provided. If desired, there may be a common electrode 118, shown as grounded. For the primary connection and for relating voltage at opposite faces of the transversely polarized portion 114 of the slab 110, there is an electrode 120 opposite the common electrode 118. For relating voltages to stress generated in the longitudinal direction of the slab 110, there is a secondary or high-voltage electrode 122 cooperating with the common electrode 118. The electrode 122 is shown as connected to a terminal 124 of an output load 126 grounded at its opposite end.

In the arrangement illustrated in FIG. 1, a voltage applied between the electrodes 118 and 120 is stepped up to a high voltage between the electrodes 118 and 122 for supplying the load 126 at a much higher voltage than that applied between the electrodes 118 and 120.

An inherent problem of such prior piezoelectric transformers is that they have relatively low power transmission capacity. This disadvantage of prior piezoelectric transformers relates to the fact that little or no mechanical advantage is realized between the driver portion of the device and the driven portion of the device. This inherently restricts the mechanical energy transmission capability of the device, which, in turn, inherently restricts the electrical power handling capacity of such devices. Additionally, because the piezoelectric voltage transmission function of Rosen-type piezoelectric transformers is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

Because the typical prior piezoelectric transformer accomplishes the piezoelectric voltage transmission function by proportionate changes in the x-y and y-z surface areas (or, in certain embodiments, changes in the x-y and x'-y' surface areas) of the piezoelectric member, it is generally necessary to alternatingly apply positive and negative voltages across opposing faces of the "driver" portion of the member in order to "push" and "pull", respectively, the member into the desired shape. Prior electrical circuits which incorporate such prior piezoelectric transformers are relatively inefficient because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability.

Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Another problem with prior piezoelectric transformers is, because the power transmission capacity of such prior piezoelectric transformers is low, it is necessary to combine several such transformers together into a multi-layer "stack" in order to achieve a greater power transmission capacity than would be achievable using one such prior transformer alone. This, of course, increases both the size and the manufacturing cost of the transformer; and the resulting power handling capacity of the "stack" is still limited to the arithmetic sum of the power handling capacity of the individual elements.

Another problem with prior piezoelectric transformers is that they are difficult to manufacture because individual ceramic elements must be polarized at least twice each, and the directions of the polarization must be different from each other.

Another problem with prior piezoelectric transformers is that they are difficult to manufacture because it is necessary to apply electrodes not only to the major faces of the ceramic element, but also to at least one of the minor faces of the ceramic element.

Another problem with prior piezoelectric transformers is that they are difficult to manufacture because, in order to electrically connect the transformer to an electric circuit, it is necessary to attach (i.e. by soldering or otherwise) electrical conductors (e.g. wires) to electrodes on the major faces of the ceramic element as well as on at least one minor face of the ceramic element.

Another problem with prior piezoelectric transformers is that the voltage output of the device is limited by the ability of the ceramic element to undergo deformation without cracking or structurally failing. It is therefore desirable to provide a piezoelectric transformer which is adapted to deform under high voltage conditions without damaging the ceramic element of the device.

It is another problem with prior transformers that they cannot withstand heat loads in excess of 600 degrees F., without sustaining damage.

It is another problem with prior transformers that they have low power utilization efficiencies, such as magnetic transformers which have an efficiency loss of up to 40–50%.

It is another problem with prior transformers that in order to handle certain ranges of frequencies, they must have a large size.

Another problem with prior transformers is that the magnetic core and coiled wire can generate magnetic fields that interfere with surrounding circuitry.

In addition to "Rosen" type piezoelectric transformers, thickness mode multilayer piezoelectric transformers are known, as shown in FIG. 4. U.S. Pat. No. 5,834,882 to Bishop describes a multilayered, laminated, piezoelectric transformer which demonstrates the ability to convert a primary or input voltage $V_{in}$ to a secondary or output voltage $V_{out}$ through the application of voltage $V_{in}$ to a first polarized piezoelectric ceramic wafer. The application of a voltage $V_{in}$ to the first piezoelectric wafer generates an extensional stress in that wafer which is then mechanically transmitted to a second tightly adhered polarized piezoelectric ceramic wafer which undergoes a similar and proportional extensional stress, producing output voltage $V_{out}$.

A problem with these types of prior multilayer piezoelectric transformers is that they are difficult to manufacture because it is necessary to bond at least two ceramic layers together.

Another problem with prior piezoelectric transformers is that they are difficult to manufacture because of the use of adhesives to bond the ceramic layers and electrodes.

Another problem with prior piezoelectric transformers is that for a particular thickness of ceramic, their resonant frequencies are dependent upon the diameter of the ceramic layer.

SUMMARY OF THE INVENTION

The term piezoelectric transformer is here applied to an energy-transfer device employing the properties of a piezoelectric material to achieve the transformation of voltage or current or impedance. It is a primary object of the present invention to provide a piezoelectric transformer comprising a ceramic element exhibiting piezoelectric properties, which has electrodes bonded to both faces of the ceramic element. At least one face of the ceramic element has multiple electrodes bonded to it such that deformation of the ceramic element across one electrode segment results in corresponding deformation of the ceramic element in adjacent electrode segments.

It is another object of the present invention to provide a piezoelectric transformer of the character described in which application of a first voltage across a first electrode segment causes a first deformation of the ceramic element at that electrode segment.

It is another object of the present invention to provide a piezoelectric transformer of the character described in which such a first deformation causes a corresponding deformation of the adjacent sections of the ceramic element in the same direction (i.e. substantially parallel to the interface plane).

It is another object of the present invention to provide a piezoelectric transformer of the character described in which such a deformation of the adjacent piezoceramic element sections produces a second voltage across the electrode segments at the adjacent sections of the ceramic element.

It is another object of the present invention to provide a piezoelectric transformer of the character described which may be easily and inexpensively produced.

It is another object of the present invention to provide a piezoelectric transformer of the character described which is easy to manufacture because it is sufficient to polarize each ceramic element only once and in only one direction.

It is another object of the present invention to provide a piezoelectric transformer of the character described which is easy to manufacture because it is sufficient to apply electrodes only to the major faces of a ceramic element, and which does not require application of electrodes to minor faces of the ceramic element.

It is another object of the present invention to provide a piezoelectric transformer of the character described in which electrode segments on a single face of the piezoceramic element are electrically isolated from each other.

It is another object of the present invention to provide a piezoelectric transformer of the character described which electrically isolates the voltage and current at the input to the device from the voltage and current at the output of the device.

It is another object of the present invention to provide a piezoelectric transformer of the character described which is easy to manufacture and miniaturize, for example by using Micro Electronic Machining Systems (MEMS).

It is another object of the present invention to provide a piezoelectric transformer of the character described which is easy to connect or install in an electric circuit, because it is sufficient to attach (i.e. by soldering or otherwise) electrical conductors (e.g. wires) only to electrodes on the major faces of the ceramic element.

It is another object of the present invention to provide a piezoelectric transformer of the character described which is operable throughout a broad thermal range.

It is another object of the present invention to provide a piezoelectric transformer of the character described wherein application of a voltage across spaced apart input electrode segments creates vibration of the transformer in a tangential, radial and/or thickness mode.

It is another object of the present invention to provide a piezoelectric transformer of the character described wherein application of a voltage across spaced apart input electrode segments creates a standing compression wave in the ceramic element.

It is another object of the present invention to provide a piezoelectric transformer of the character described wherein such a standing compression wave in the ceramic element is at the resonant frequency of the ceramic element.

It is another object of the present invention to provide a piezoelectric transformer of the character described wherein sequential application of a voltage across input electrode segments creates a traveling compression wave in the ceramic element.

It is another object of the present invention to provide a piezoelectric transformer of the character described wherein such a traveling compression wave in the ceramic element creates output voltages whose phases are dependent on the phases of the input voltages.

It is another object of the present invention to provide a piezoelectric transformer of the character described with a traveling compression wave in the ceramic element that may be used in polyphase power applications.

It is another object of the present invention to provide a piezoelectric transformer of the character described wherein the output voltages may drive more than one load.

It is another object of the present invention to provide a piezoelectric transformer of the character described wherein the output voltages may be added in series to drive a single load.

It is another object of the present invention to provide a piezoelectric transformer of the character described wherein the output of one electrode segment may be used to provide a feedback voltage to the driving circuit of the piezoelectric transformer.

Further objects and advantages of my invention will become apparent from a consideration of the drawings and ensuing description thereof.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 1:
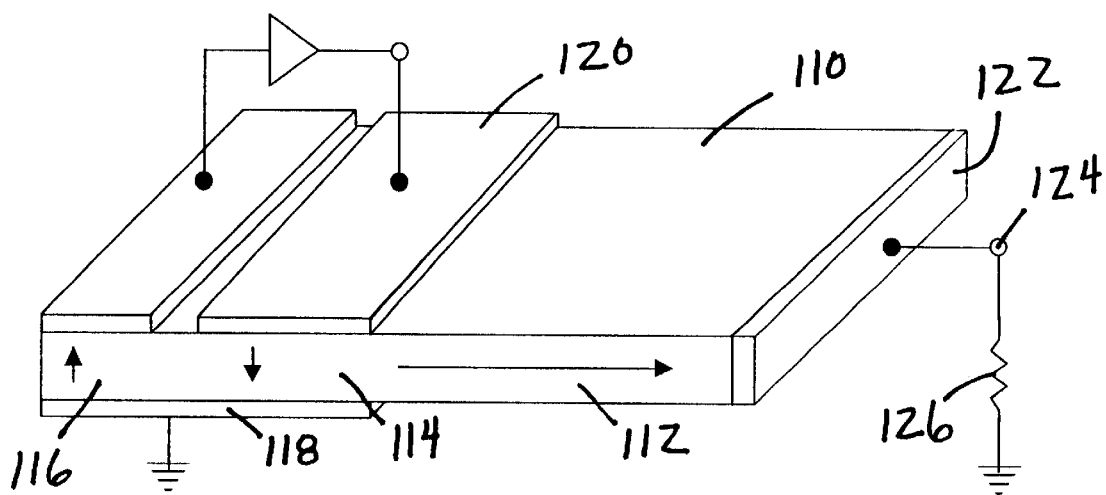
FIG. 1 is a perspective view showing the construction of a Rosen-type piezoelectric transformer of the prior art.
Figure 2:
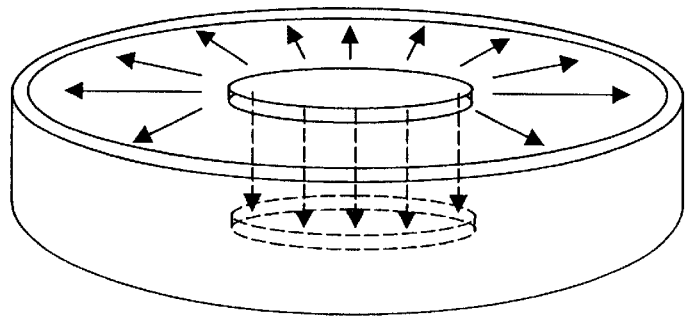
FIG. 2 is a perspective view showing the construction of a disk-shaped Rosen-type piezoelectric transformer of the prior art.
Figure 3:
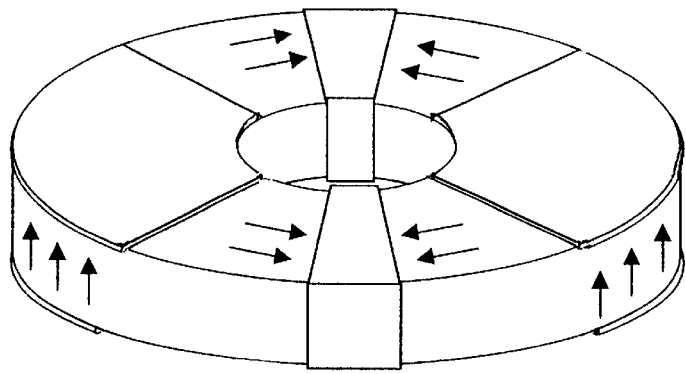
FIG. 3 is a perspective view showing the construction of an annular Rosen-type piezoelectric transformer of the prior art.
Figure 4:
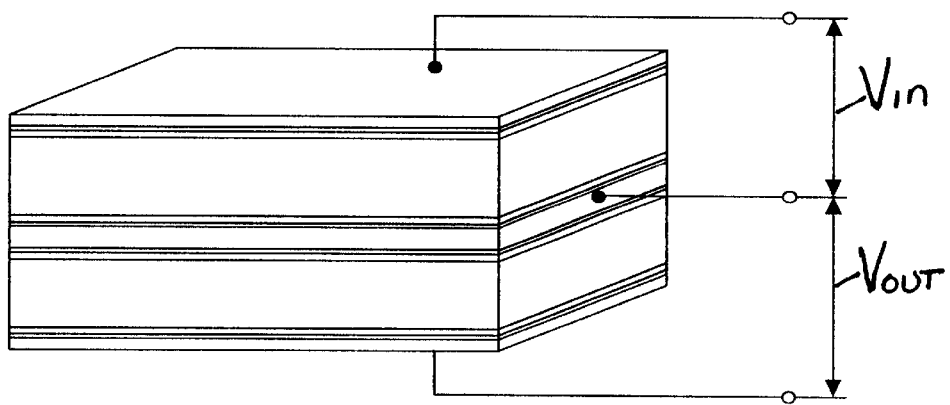
FIG. 4 is a perspective view showing the construction of a multilayer piezoelectric transformer of the prior art.
Figure 5:
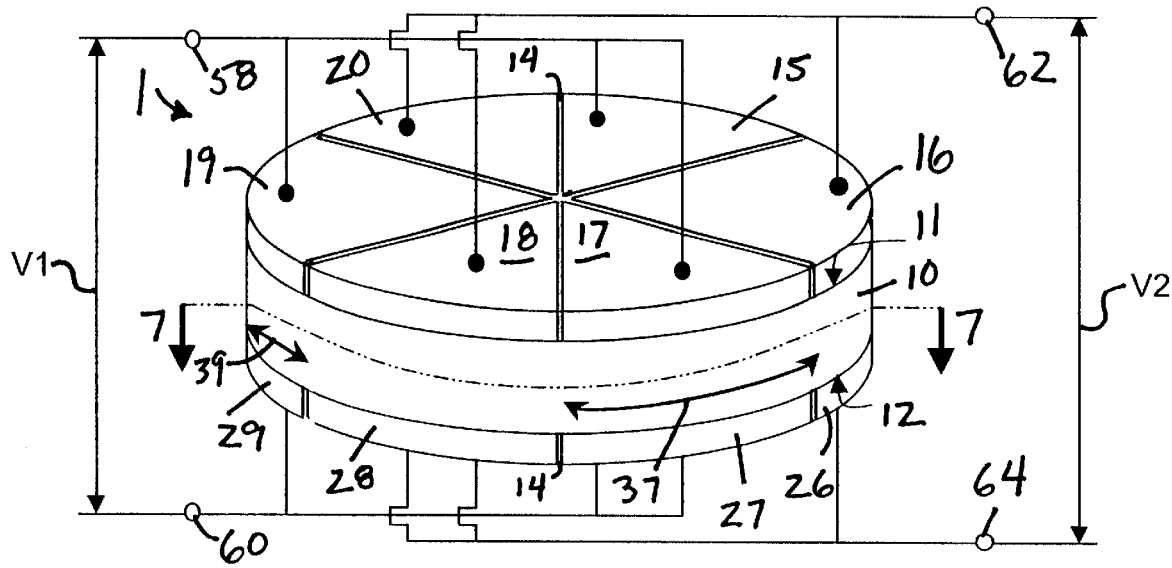
FIG. 5 is a perspective view showing the preferred embodiment of a piezoelectric transformer with segmented electrodes on two sides of the ceramic disk constructed in accordance with the present invention.

In the preferred embodiment of the invention, a piezoelectric transformer (generally designated 1 in the accompanying drawing figures) is manufactured by bonding segmented electrodes to a piezoelectric ceramic layer as illustrated in FIG. 5, and as will be more fully described below.

In the preferred embodiment of the invention, the transformer 1 comprises a piezoelectric ceramic disk 10 having two substantially parallel major faces 11 and 12. The ceramic disk 10 has a circular shape which allows the piezoelectric ceramic disk 10 to vibrate with essentially one resonant frequency. The ceramic disk 10, however, may have another shape that is sufficiently symmetric to allow resonant vibration, preferably without the introduction of higher order harmonics and interference. The reason a circular shape is preferred relates to the degrees of freedom of the device. A circular (or disc) shape transformer 1 has only a limited number of modes at which it can vibrate. By way of comparison, a square is not geometrically uniform about any point. A rectangle is even less uniform, and, therefore, can vibrate in several different modes. The power transmission capability of the transformer depends on the efficiency by which it transfers mechanical (i.e. vibration) energy from one segment of the ceramic disk to another. The more modes of vibration, the less efficiently that energy is transmitted.

Accordingly, in the preferred embodiment of the invention (wherein high power transmission efficiency is desirable) it is desirable that a symmetric (i.e. circular) transformer 1 be used. However, in certain other applications (for example in wide bandwidth signal transmission) wherein constancy of voltage gain over a wide signal input frequency range is desirable, the transformer may be asymmetrically shaped.

More specifically, the transformer 1 is generally between ½" and 1" diameter and resonates at a frequency between 85 and 150 kHz. The operating frequency of the transformer depends, in part, on the dimensions of the ceramic disk 10, such as its thickness and diameter. In the preferred embodiment of the invention, the thickness of the ceramic disk 10 is in the range of 0.030 to 0.500 inches. Generally, the thickness is preferably somewhat thin, which condition provides a better wave form and less energy dissipation within the ceramic disk 10. However, if the ceramic is too thin then the power transmission capability will be too low for use in the certain circuit application. The above discussion of the typical size range of the device is not a limitation but merely illustrative of ranges typically used. Smaller devices or larger devices may be constructed that are operative for different levels of power transmission, load, voltage and frequency.

In the preferred embodiment of the invention the ceramic disk 10 of the transformer 1 is made of a "hard" ceramic material. "Hard" ceramics are desirable because they can withstand high levels of electrical excitation and mechanical stress and typically have high Q factors. The dielectric losses in hard ceramics are also minimized at high frequency resonant operation of the piezoelectric transformer. Examples of "hard" ceramic materials include, but are not limited to; PZT-4 (DOD Type I) and PZT-8 (DOD Type III) as manufactured by Morgan Matroc Company; or APC-841 as manufactured by American Piezo Ceramics, Inc. By way of example, APC 841 has the following characteristics: 0.35% dissipation factor measured at C1 KC@ Low Field; 320 degree C. Curie Temperature; 0.033 to 0.067 coupling coefficient; 109 m/V to $450 \times 10^{-12}$ m/V piezoelectric coefficient; 10.5 to $35 \times 10^{-3}$ m$^2$/C piezoelectric coefficient; 6.3 to $7.6 \times 10^{10}$ N/m$^2$ Young's Modulus; 2070 m/s longitudinal mode frequency constant; 1710 m/s thickness mode frequency constant; 2260 radial mode frequency constant; 11.7 to $17.3 \times 10^{12}$ m$^2$/N elastic compliance; 7.6 g/cc density; and 1400 mechanical quality ("$Q_m$") factor.

More specifically, in the preferred embodiment of the transformer 1 the ceramic disk 10 is made of a very hard piezoelectric ceramic material, such as ceramic #841 as manufactured and sold commercially by American Piezo Ceramics, Inc. of Mackeyville, Pa. The ceramic material preferably has a high deflection per volt, a high curing temperature, does not "depole" very easily, and is hard. A material having these attributes will typically have a high "Q" rating (i.e. the power per cycle in the device divided by the power per cycle that is needed maintain the device at that power level must be high). The Q-rating of the ceramic used in the preferred embodiment of the invention is 1400.

Alternatively, a soft ceramic may be used. A "soft" ceramic may be desirable for some embodiments of the transformer 1 because it offers relatively less resistance to being mechanically deformed than harder ceramic materials. A soft ceramic would be more desirable for example in low frequency resonant transformers. Since dielectric losses are minimal at lower frequencies, soft ceramics may be used may be used in low frequency applications. Examples of "soft" ceramic materials include, but are not limited to; PZT-5A (DOD Type II) and PZT-5B (DOD Type III) as manufactured by Morgan Matroc Company; or APC-850 as manufactured by American Piezo Ceramics, Inc. By way of example, APC 850 has the following characteristics: 1.4% dissipation factor measured at C1 KC@ Low Field; 360 degree C. Curie Temperature; 0.036 to 0.072 coupling coefficient; 175 m/V to $590 \times 10^{-12}$ m/V piezoelectric coefficient; 12.4 to $36 \times 10^{-3}$ m$^2$/C piezoelectric coefficient; 5.4 to $6.3 \times 10^{10}$ N/m$^2$ Young's Modulus; 1900 m/s longitudinal mode frequency constant; 1530 m/s thickness mode frequency constant; 2030 radial mode frequency constant; 15.3 to $17.3 \times 10^{12}$ m$^2$/N elastic compliance; 7.7 g/cc density; and 80 mechanical quality ("$Q_m$") factor.

Figure 11:
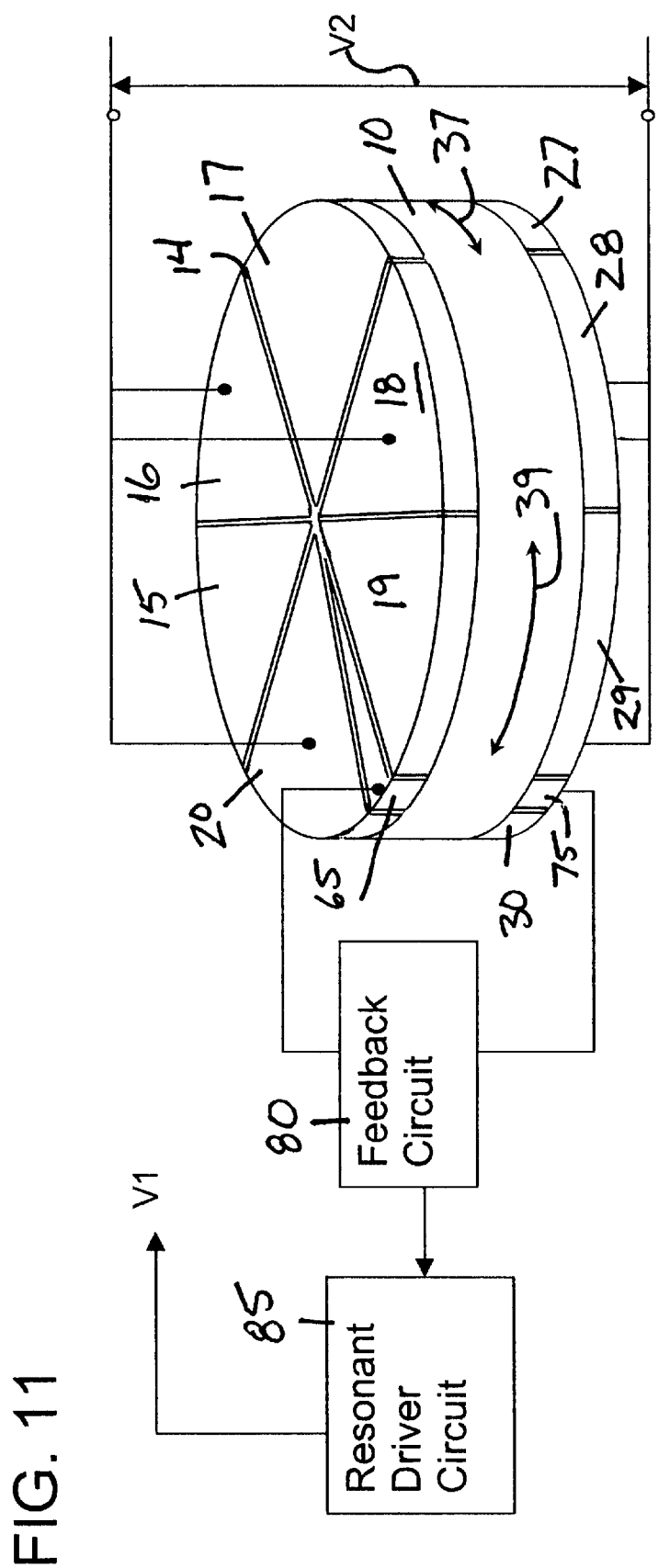
FIG. 11 is a partial schematic perspective view showing an embodiment of a piezoelectric transformer having an electrode segment suitable for providing a feedback frequency signal to a resonant driver circuit.

Referring to FIG. 5: Deposited on one face 11 of the ceramic disk 10 is a plurality of electrodes 15, 16, 17, 18, 19 and 20. The electrodes preferably comprise pie-shaped sectors of equal size which substantially cover the entire face 11 of the ceramic disk 10. The pie shaped electrodes however need not be of equal size. Although the embodiment of FIG. 5 depicts a transformer 1 with six electrodes 15, 16, 17, 18, 19 and 20 on the first face 11 of the ceramic disk 10, and the embodiment of FIG. 11 depicts four such electrodes 71, 72, 73 and 74, it will be understood that there may be any number of electrodes (2 or more) on the face 11 of the ceramic disk 10 and it need not be an even number. It will be further understood that the electrodes may be of various sizes which need not be of equal shape or area.

Figure 6:
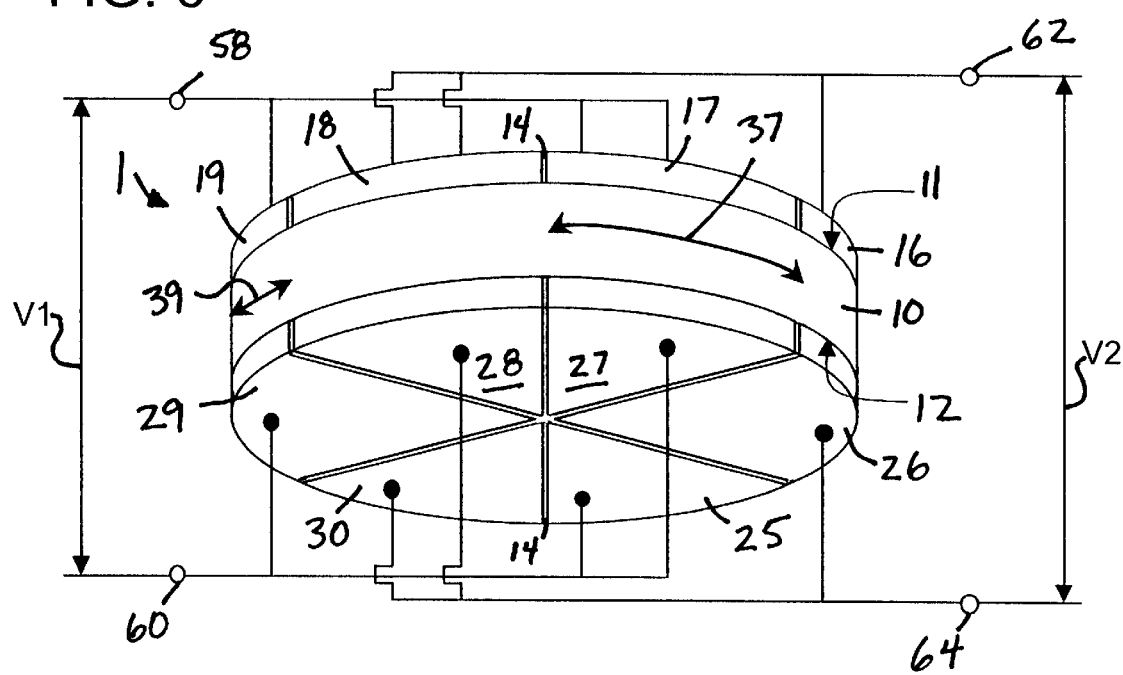
FIG. 6 is a perspective view of the opposite side of the piezoelectric transformer of FIG. 5 and showing the electrical connections on that side.

On the second face 12 of the ceramic disk 10 is deposited at least one electrode. As shown in FIG. 11, in one embodiment of a piezoelectric transformer 2, there may be one common electrode 70 which covers the entire face 12 of the ceramic disk 10. As shown in FIG. 6 however, in the preferred embodiment of a piezoelectric transformer 1, the electrodes on the second face 12 of the ceramic disk 10 are segmented in the same manner as the electrodes on the first face 11 of the ceramic disk 10. More specifically, the electrodes on the second face 12 of the ceramic disk 10 are of the same size, shape, and configuration as the electrodes on the first face 11 of the ceramic disk 10. Thus, for example, the electrode 15 on the first face 11 and electrode 25 on the second face 12 of the ceramic disk 10 have the same dimensions and the edges of each electrode 15 and 25 are aligned in the direction parallel to the faces 11 and 12 of the ceramic disk 10.

It will be understood that, although one embodiment of a piezoelectric transformer 1 has an equal number of aligned electrodes on each face 11 and 12 of the ceramic disk 10, there may be as few as one electrode 24 on the second face 12 of the ceramic disk 10. There may also be any number of electrodes of various sizes and shapes on the second face 12 of the ceramic disk 10 and the edges of the electrodes on the second face 12 need not be aligned with the edges of the electrodes on the first face 11 of the ceramic disk 10. For example, there may be six electrodes on the first face and three electrodes covering the second face 12 of the ceramic disk 10, such that one electrode on the second face 12 may be aligned with two of the electrodes on the first face 11. Alternately, one of three electrodes on the second face 12 may be configured such that it is not aligned with the edges of two electrodes on the first face 11, and therefor is aligned with only portions of two of the electrodes on the first face 11.

In the preferred embodiment of a piezoelectric transformer 1, the piezoelectric ceramic disk 10 has the electrodes screen printed or electro-deposited on its two opposing major faces 11 and 12. The electrodes may also be bonded to the ceramic disk 10 by manufacturing the transformer 1 using a process such as cofiring.

To improve the durability of or as an alternative to electro-deposited electrodes, separate electrodes may be bonded to the electrodes on one or both faces 11 and 12 of the piezoelectric ceramic disk 10 with an adhesive (not shown) such as "Cibageigy AV118" as manufactured by Ciba Specialty Chemicals Corporation, N.A. of East Lansing, Mich. While "Cibageigy AV118" adhesive is used in one embodiment of the invention, it is within the scope of the present invention to use other adhesives, such as LaRC-SI$_{TM}$ adhesive, a thermoplastic soluble imide developed by NASA-Langley Research Center and commercially marketed by IMITEC, Inc. of Schenectady, N.Y. Desirable properties in the adhesive are a melting point below that of the ceramic disk 10 of the transformer 1, the capability to harden to apply a bond between the terminals and the ceramic disk 10, and the capability to transfer longitudinal stress between the electrodes and the ceramic disk 10 of the transformer 1.

For embodiments using an adhesive, the entire stack of laminate layers (i.e. the ceramic disk 10, the electrodes, and the adhesive) are heated to a temperature above the melting point of the adhesive materials. The entire stack of laminate layers is then permitted to cool to ambient temperature. As the temperature of the ceramic disk 10, the electrodes, and the adhesive layers falls below the melting temperature of the adhesive materials, the adhesive layers solidify, bonding the adjacent layers. During the cooling process the ceramic disk 10 may become compressively stressed (prestressed) along its longitudinal axis due to the relatively higher coefficient of thermal contraction of the materials of construction of the adhesive. It will be understood that a piezoelectric transformer 1 constructed in accordance with the preceding description comprises a ceramic disk 10 which is longitudinally pre-stressed (i.e. compressed) along its major faces 11 and 12.

In the preferred embodiment of a piezoelectric transformer 1, the electrodes 15, 16, 17, 18, 19 and 20 on a face 11 are separated from each other using a thin dielectric layer 14. The dielectric 14 prevents adjacent electrodes (for example, 15 and 16) from shorting across the gap between the electrodes 15 and 16. The dielectric 14 may be screen printed on the face 11 of the ceramic disk 10 just as the electrodes 15, 16, 17, 18, 19 and 20 are screen printed. In embodiments of the piezoelectric transformer 1 which have multiple electrodes 25, 26, 27, 28, 29, and 30 on the second face 12 of the ceramic disk 10, the electrodes 25, 26, 27, 28, 29, and 30 are separated by a dielectric 14 in a like manner. It will be appreciated that in this embodiment of the transformer 1, adjacent electrode segments 15, 16, 17, 18, 19 and 20 on the first face 11 are electrically isolated from each other by the dielectric 14. In a like manner, adjacent electrode segments 25, 26, 27, 28, 29, and 30 on the second face 12 are also electrically isolated from each other by the dielectric 14. The dielectric substance preferably has a dielectric constant greater than 1000. Thus it will be understood that a transformer 1 constructed in accordance with this embodiment of the invention may be used in an electric circuit to electrically protect electrical components from damage from high current discontinuities Referring now to FIG. 7 taken in conjunction with FIGS. 5 and 6: Electrodes 15 and 25 are of equal dimensions and are bonded to the ceramic disk 10 such that their edges are aligned. Planes connecting the edges of the electrode 15 to the edges of electrode 25 on each face 11 and 12 of the ceramic disk define a wedge-shaped section 10a of the ceramic disk 10 (defined by solid lines in FIG. 7). The wedge shaped section 10a is a portion of the ceramic disk 10 with a radius $R_0$ and whose outer edge is a circumferential arc segment with length $S_0$. Adjacent wedge shaped section 10b of the ceramic disk 10 may be defined in a like manner with planes running between corresponding edges of electrodes 16 and 26. Adjacent wedge shaped section 10f of the ceramic disk 10 may be defined in a like manner with planes running between corresponding edges of electrodes 20 and 30. Further wedge shaped sections 10c, 10d and 10e may be defined in a like manner.

The ceramic disk 10 is electrically polarized substantially throughout its mass in a direction perpendicular to the (i.e. in the thickness direction) of the ceramic disk 10. The polarization vector of the wedge shaped segments 10a, 10b, 10c, 10d, 10e and 10f is preferably in the same direction. It is possible however to "reverse pole" any or all segments such that, for example, sections 10a, 10c 10f and 10e are poled in one direction perpendicular to the faces 11 and 12 of the ceramic disk 10, and the remaining segments 10b, 10d, and 10f are poled in a parallel but opposite direction perpendicular to the faces 11 and 12 of the ceramic disk 10.

In the preferred embodiment of the piezoelectric transformer 1 the ceramic disk 10 is polarized such that when a voltage potential is applied across the electrodes 15 and 25 on its respective major faces 11 and 12, the section 10a of the ceramic disk 10 between those electrodes 15 and 25 will longitudinally strain. Conversely, in the preferred embodiment of the piezoelectric transformer 1 the ceramic disk 10 is polarized such that when a section 10a of the ceramic disk 10 is longitudinally strained, a voltage potential is generated between the corresponding electrodes 15 and 25, on its respective major faces 11 and 12. Application of a voltage across the other wedge shaped sections will likewise cause them to longitudinally strain and vice versa.

Figure 7:
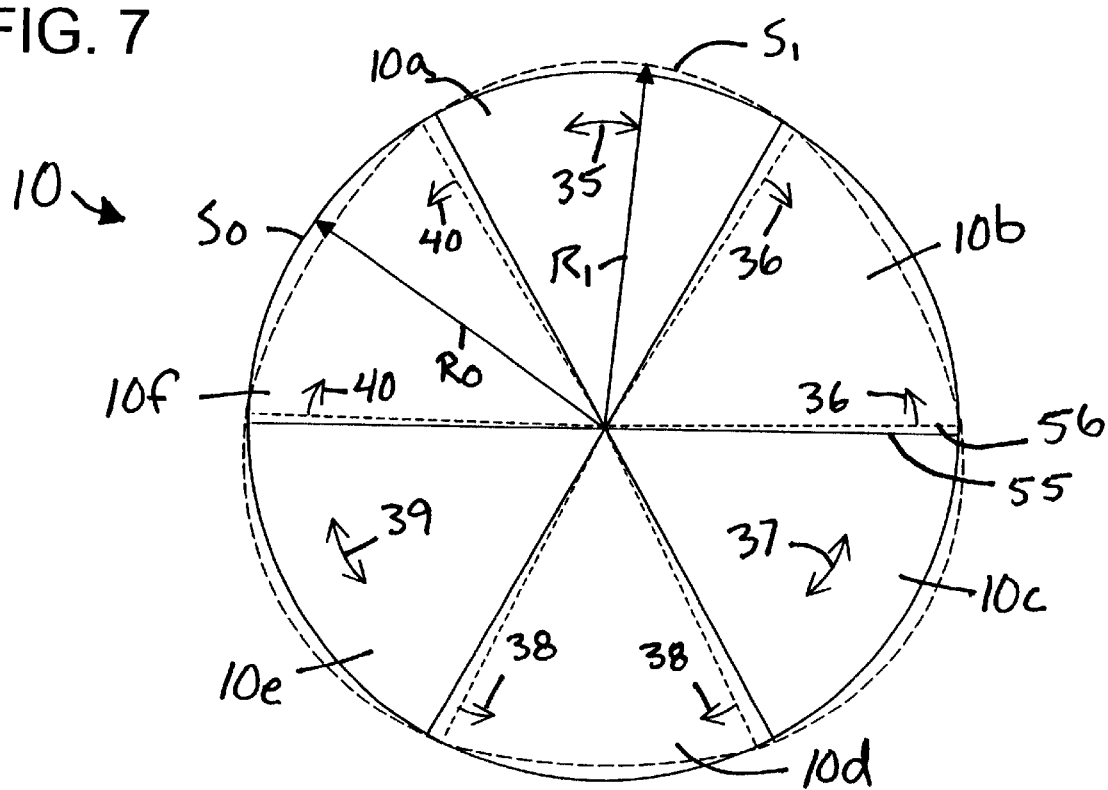
FIG. 7 is a view along line 7—7 of FIG. 5 showing the flexing that the ceramic disk undergoes upon application of a voltage of a first polarity across the electrode segments.

In other words, in the transformer 1 of FIGS. 5 and 6, ceramic layer 10 is polarized between the electrodes 15, 16, 17, 18, 19 and 20 on the first face 11 of the ceramic disk and the electrodes 25, 26, 27, 28, 29 and 30 on the second face 12 of the ceramic disk 10. The transformer 1 is polarized such that when a first voltage V1 of a first polarity is applied between facing electrodes such as electrode 15 and electrode 25, ceramic layer 10 tends to tangentially elongate (as indicated by arrow 35) in a direction parallel to the longitudinal plane of the composite structure as illustrated in FIG. 7. Furthermore, when a voltage V1 of a second polarity is applied between facing electrodes 15 and 25, ceramic layer 10 tends to tangentially contract (as indicated by arrows 45) in a direction parallel to the longitudinal plane of the composite structure as illustrated in FIG. 8.

As stated above, a voltage potential V1 of a first polarity is applied across electrodes 15 and 25 to wedged shaped section 10a. Wedge shaped section 10a initially has a radius of $R_0$ and a circumferential arc length of $S_0$ (as do all the other wedge shaped sections in this embodiment). When a voltage potential V1 is applied across electrodes 15 and 25, the piezoelectric ceramic in the wedge shaped section 10a between electrodes 15 and 25 deforms in a tangential direction as shown by arrow 35. The wedge shaped section 10a deforms into a wedge shape (as indicated by broken lines in FIG. 7) with radius $R_1$ and circumferential arc length $S_1$, as illustrated in FIG. 7. The deformed wedge shape section 10a with radius $R_1$ and arc length $S_1$ is larger both in its radius and in its arc length than undeformed wedge section 10a.

Figure 8:
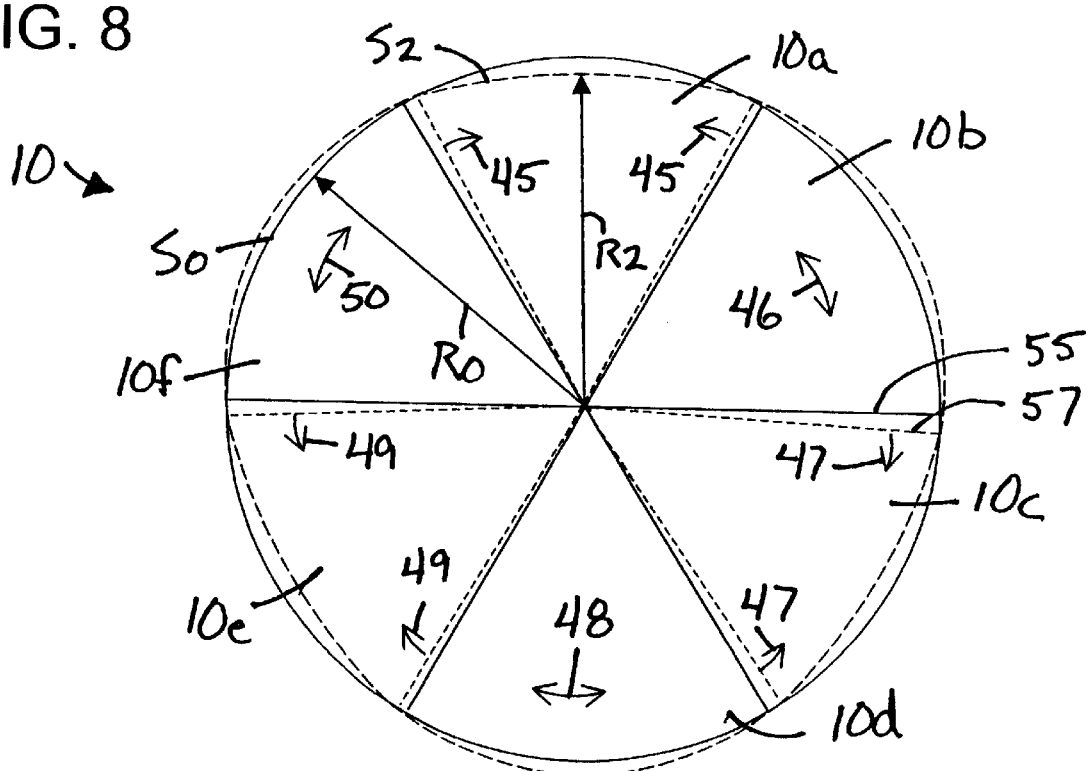
FIG. 8 is a view along line 7—7 of FIG. 5 showing the flexing that the ceramic disk undergoes upon application of a voltage of a second (opposite) polarity across the electrode segments.

When a voltage potential V1 of a second (opposite) polarity is applied across electrodes 15 and 25, wedged shaped section 10a piezoelectrically deforms as indicated by broken lines in FIG. 8. More specifically, the piezoelectric ceramic in the wedge shaped section 10a between electrodes 15 and 25 deforms tangentially in the direction of arrows 45. The wedge shaped section 10a deforms, contracting into a wedge shaped section 10a with new radius $R_2$ and circumferential arc length $S_2$. The deformed wedge shaped section 10a with radius $R_2$ and arc length $S_2$ is smaller both in its radius and in its arc length than undeformed wedge section 10b.

It will be understood that application of a voltage across the electrodes corresponding to any of the wedge shaped sections 10a, 10b, 10c, 10d, 10e and 10f, will cause that wedge shaped section to piezoelectrically deform, expanding or contracting depending on the polarity of the voltage applied across the electrodes on the faces of the wedge shaped section.

Again referring to FIGS. 5 and 7: When a voltage V1 of a first polarity is applied a cross the electrodes 15 and 25 of wedge shaped section 10a of the ceramic disk 10, the wedge 10a tangentially expands in the direction of arrow 35. The expanding wedge 10a applies a compressive force to adjacent wedges 10b and 10f in the direction of arrows 36 and 40, respectively. By simultaneously applying a voltage V1 of the same polarity to wedge sections 10c and 10e, additional compressive forces in the direction of arrows 36, 38 and 40 may be applied to adjacent wedge sections 10b and 10f as well as wedge section 10d.

Referring now to FIG. 8: Conversely, when a voltage V1 of a second opposite polarity is applied to a wedge shaped section 10a of the ceramic disk 10, the wedge 10a contracts in the direction of arrows 45. The contracting wedge 10a exerts a tensile force on adjacent wedges 10b and 10f in the direction of arrows 46 and 50, respectively. The force exerted by the contraction of wedge 10a in the direction of arrows 45 "pulls" on the adjacent wedges 10b and 10f making them elongate tangentially, respectively. By simultaneously applying a voltage V1 of the same polarity to wedge sections 10c and 10e, additional "pulling" forces in the direction of arrows 46, 48 and 50 may be applied to adjacent wedge sections 10b and 10f as well as wedge section 10d.

Thus, application of a voltage V1 across facing electrodes generates a tangential expansion or contraction of the wedge shaped section between those electrodes depending on the polarity of the applied voltage. As shown in FIG. 7, upon application of a voltage V1 of a first polarity, the tangential expansion of a wedge shaped section, for example section 10a, places adjacent wedge shaped sections 10f and 10b under a tangential compression. This substantially tangential compression of the adjacent wedge shaped sections 10f and 10b in the ceramic disk 10 results in the piezoelectric generation of a second voltage V2 between the electrodes 20 and 30, and 16 and 26 of the adjacent wedge shaped sections 10f and 10b respectively.

Similarly, as illustrated in FIG. 8, when the polarity of the voltage V1 across the facing electrodes of a wedge shaped section is reversed, the wedge shaped section between those electrodes contracts. The tangential contraction of the wedge shaped section, for example section 10c, places adjacent wedge shaped sections 10b and 10d under a tangential tension. This tensile strain in adjacent wedge shaped sections 10b and 10d causes a second voltage V2 of reverse polarity to be piezoelectrically generated between the electrodes 16 and 26, and 18 and 28 of the adjacent wedge shaped sections 10b and 10d respectively.

As illustrated in FIGS. 5 and 6, application of an input voltage of a first polarity V1 across electrodes 15 and 25, 17 and 27, and 19 and 29, causes the ceramic disk 10 deform as shown in FIG. 7, from relaxed position 55 (shown in solid lines) into deformed position 56 (shown in broken lines). This voltage causes sections 10a, 10c, and 10e to expand, and that expansion causes sections 10b, 10d and 10f to be compressed. Conversely, application of an input voltage V1 of opposite polarity across electrodes 15 and 25, 17 and 27, and 19 and 29, causes the ceramic disk 10 deform as shown in FIG. 8, from relaxed position 55 into deformed position 57 (shown in broken lines). This voltage causes sections 10a, 10c, and 10e to contract, and this contraction causes sections 10b, 10d and 10f to expand.

When a primary (i.e. input) voltage V1 is applied across terminals 58 and 60 connected to the electrodes 15 and 25, respectively, of the ceramic disk 10 the ceramic disk 10 will piezoelectrically generate an extensional stress. As used herein, "extensional stress" and cognate terms refer to stress which is parallel to the major surfaces of the piezoelectric ceramic disk 10. The extensional stress is commensurate with the magnitude of the input voltage V1, the piezoelectric properties of the ceramic disk 10 material, the size and geometry of the ceramic disk 10, and the elasticity of the other materials of the transformer (i.e. the electrodes that are bonded to the ceramic disk 10).

Figure 9:
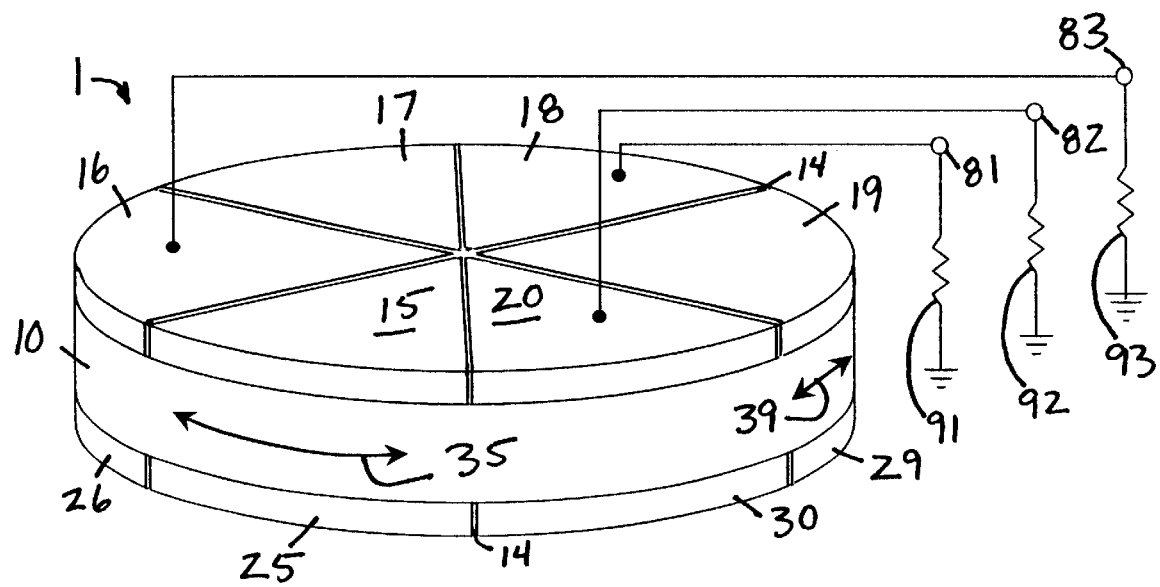
FIG. 9 is a perspective view showing an embodiment of a piezoelectric transformer with the electrical terminal configuration for applying output voltages to drive multiple loads.

The extensional stress which is generated by the input voltage V1 causes the segment 10a of the ceramic disk 10 between the electrodes 15 and 25 to be longitudinally strained, (i.e. parallel to the major surfaces of the ceramic disk 10, as indicated by arrow 35 in FIG. 7 and arrow 45 in FIG. 8). Because the ceramic disk 10 is a discrete unit, any longitudinal strain 35 or 45 of the wedge shaped segment 10a will result in a longitudinal strain in the adjacent wedge shaped segments 10b and 10f (as indicated by arrows 36 and 40 in FIG. 7 and arrows 46 and 50 in FIG. 8). The longitudinal strains 36 and 40 or 46 and 50 in the adjacent wedge shaped segments 10b and 10f generate a voltage potential V2 across the electrodes 16 and 26 of adjacent wedge shaped segment 10b and across the electrodes 20 and 30 of adjacent wedge shaped segment 10f. Electric terminals 62 and 64 may be electrically connected to corresponding electrodes 16 and 26 of adjacent wedge shaped segment 10b and to electrodes 20 and 30 of adjacent wedge shaped segment 10f to connect the output voltage V2 to one or more loads. Although the embodiment of FIGS. 5 and 6 depicts output terminals 62 and 64 as being common to all the output electrodes, alternatively, each set of facing electrodes may have separate terminals 81, 82 and 83 as illustrated in FIG. 9.

Referring to FIG. 5: It will be understood that the ratio of the first voltage V1 to the second voltage V2 is a function of the piezoelectric properties of the ceramic disk 10, the size and geometry of the electrode segments and corresponding wedge shaped ceramic sections, the polarity characteristics of the ceramic disk 10. The relationship between the first voltage V1 to the second voltage V2 is also a function of the applied frequency and the load to which the output voltage is applied. It will also be understood that the first voltage V1 may alternatively be either an "input" (i.e. primary) voltage or an "output" (i.e. secondary) voltage, and the second voltage V2 may respectively be either an "output" (i.e. secondary) voltage or an "input" (i.e. primary) voltage.

Referring again to FIGS. 7 and 8: FIGS. 7 and 8 are schematic plan views showing the flexing which the ceramic disk 10 undergoes upon the application of voltages of different polarities to wedge shaped sections 10a, 10c and 10e. It will be understood that the flexing of the wedge shaped sections in compression and tension of transformer 1 illustrated in FIGS. 7 and 8 is also experienced by the embodiment of the transformer 2 illustrated in FIG. 9. FIGS. 7 and 8 are illustrative of only one cycle of compression and tension (from position 55 to position 56, and from position 55 to 57) which may occur in a symmetrically sectioned ceramic disk 10.

It has been shown that in a piezoelectric transformer 1, the voltages applied across sections 10a, 10c and 10e can be of either polarity so that the sections can experience compression as well as expansion. It will be understood that sections 10b, 10d and 10f of the ceramic disk 10 may also have voltages applied to them to cause expansion or compression. It will be further understood that voltages may be applied to only one section of the disk 10, or to two or more sections of the ceramic disk 10 simultaneously. It will be further understood that the number of wedge shaped sections may be reduced or increased and that the wedges need not be equal in shape.

Application of an oscillating voltage to piezoelectric ceramic wedge shaped section 10a will cause it to vibrate (radially and tangentially expand and contract) at the frequency of the voltage applied between electrodes 15 and 25. If the oscillating voltage is applied simultaneously and in phase to sections 10a, 10c and 10e the composite structure will vibrate as illustrated in FIG. 7 and 8 (from position 55 to position 56 to position 55 to position 57). When the frequency of the voltage applied between electrodes is selected to match (or substantially match) the natural frequency of the transformer 1, the composite structure will vibrate as illustrated in FIGS. 7 and 8 and tends to resonate.

Simultaneous (i.e. in phase) application of an oscillating voltage of constant frequency to alternating segments(i.e., every other segment) of the transformer 1 can produce a standing wave pattern in the ceramic disk 10. A standing wave can occur in the disk if the geometry of the disk 10 is chosen to be symmetrical (i.e., a circular disk with an even number of electrode segments of equal geometry as in FIGS. 5 and 6). Furthermore, if the frequency of the voltage is chosen to match the natural frequency of the ceramic disk 10, the disk will resonate about a narrow bandwidth. During resonant operation of the transformer 1, a voltage gain may be realized between the "output" electrodes on the faces of the segments adjacent to the "input" segments.

It will be understood that the input voltage need not be applied simultaneously to several alternating sections to create a standing wave configuration. A voltage may be applied sequentially across sections of the ceramic disk 10, to create a traveling wave. As used herein, a traveling wave is the resulting compression or tension in wedge shaped sections adjacent to an input wedge section and the output voltage associated with that compression or tension. More specifically, when an input voltage V1 is applied across electrodes 15 and 25, wedge shaped section 10a may expand causing sections 10b and 10f to be compressed, with an associated output voltage V2 across electrodes 16 and 26, and 20 and 30 respectively. Simultaneous with the removal of the voltage V1 across section 10a, a voltage V1 maybe applied across electrodes 16 and 26, causing wedge shaped section 10b to expand causing sections 10c and 10a to be compressed, with an associated output voltage V2 across electrodes 17 and 27, and 15 and 25 respectively. A voltage V1 may be applied in a like manner to sections 10c, 10d, 10e and 10f in sequence (i.e., in a clockwise fashion) to generate a traveling compression wave in the two wedge shaped sections that are adjacent to the sections to which the voltage V1 is applied. It will be understood that the number of wedge shaped sections and corresponding electrodes may be reduced or increased and that the wedges may be of unequal shapes. It will be further understood that a voltage may be applied to more than one section at a time to generate several traveling waves, and that the voltages may also be applied in a counterclockwise manner. It will also be understood that application of a voltage V1 of opposite polarity can cause a travelling tension wave in the sections adjacent to the sections to which the voltage is applied. It will be further understood that an oscillating voltage may be applied simultaneously to adjacent sections to generate a traveling wave simply by adjusting the phase angle between the voltages applied to those adjacent sections.

It has been found that the bandwidth of voltage input V1 frequencies over which the transformation ratio (V2/V1) can be maintained at a substantially uniform value may be controlled by varying the size and shape of the transformer. Therefor, in the preferred embodiment of the invention the transformer 1 has a circular shape, which is desirable in step-up, narrow bandwidth transformer applications because the symmetry reduces the introduction of interfering secondary and harmonic vibrations in the device, thus producing narrow band resonant characteristics.

When a transformer 1 is constructed as described above (i.e., symmetrically) and when the transformer 1 is electrically actuated to operate in a resonant mode, causing "lamb" wave resonant frequency vibration of the composite device, it is possible to achieve a deformation of the ceramic disk 10 such that there is a voltage gain across the output electrodes. The ratio of the output voltage to the input voltage (V2/V1) can be a step-down or a step-up voltage ranging from (0.01)V1 to (100)V1. Thus, when an input voltage across a segment 10a of ceramic disk 10 causes the segment 10a to piezoelectrically deform, it, in turn, mechanically strains adjacent segments 10b and 10f causing them to deform, and such mechanically induced deformation of adjacent segments 10b and 10f piezoelectrically generates a second voltage across the electrodes 16 and 26, and 20 and 30 respectively on the faces of the respective adjacent segments 10b and 10f. When the applied voltage is oscillating at the natural frequency of the transformer 1, the input segment 10a and the output segments 10b and 10f will resonate. Because the achievable deformation of a segment is greatest while operating at resonance, the output voltage across the electrodes attached to the mechanically strained output segments is greater, and therefor the power transmission capacity of the described transformer 1 is greater when operating at resonance.

When operating at resonance, the transformer 1 vibrates in either the fundamental mode of vibration or harmonics of it. Dissipation of power within the ceramic is directly related to the operation frequency. Therefor, when the frequency of vibration increases, heat generation and power dissipation within the ceramic also increase. If the device is operating at a harmonic (rather than the fundamental) mode, any part of the ceramic may be vibrating and the amount of power dissipation will be relatively higher. The power transmission capability of the transformer depends on the efficiency by which it transfers mechanical (i.e. vibration) energy from one segment of the ceramic disk to another. The more modes of vibration there, the less efficiently that energy is transmitted. Accordingly, in the preferred embodiment of the invention (wherein high power transmission efficiency is desirable) it is desirable to use a symmetric (i.e. circular) transformer 1 operating in the fundamental mode.

Figure 10:
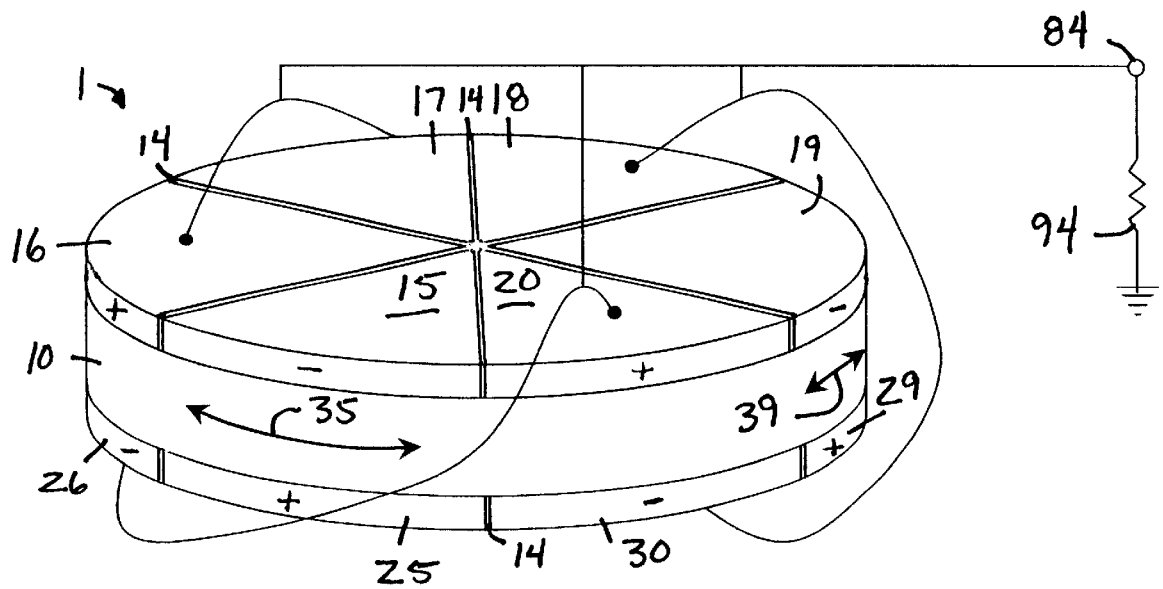
FIG. 10 is a perspective view showing an embodiment of a piezoelectric transformer with the electrical terminal configuration for summing output voltages to drive a single load.

The output voltage from the several wedge-shaped segments of the transformer 1 may be applied to loads in a variety of ways. For example, the output voltage from each electrode may be used to drive individual loads 91, 92 and 93 via terminals 81, 82 and 83 respectively, as illustrated in FIG. 9. Alternately, the output voltages may be summed in series and applied to via terminal 84 to a single load 94 as illustrated in FIG. 10. It will be understood that the series summing of the output voltages as illustrated in FIG. 10 is possible because the output electrodes 15,25, and 17, 27, and 19, 29 are electrically isolated from each other by the dielectric layers 14 and input ceramic wedge sections 10a, 10c and 10e. Current can flow from the "positive" output electrodes 26, 28 and 30 to the "negative" output electrodes 16, 18 and 20 summing the voltages across output electrode pairs.

Voltages may be applied to one or more electrode segments of the piezoelectric transformer to create a traveling compression wave in the ceramic disk. The output voltages of these electrodes need not be in phase with one another. The phases of the output voltages associated with this traveling compression wave in the ceramic disk are dependent on the phases of the input voltages. Thus, the phases of the outputs may be adjusted at each input to the transformer to provide the desired waveform. The phased output voltages associated with the traveling compression wave in the ceramic disk may be used in polyphase power applications. For example, the transformer may provide an AC output voltage that is polyphasic, such as three phase power. Alternatively, these polyphase voltages may be added and rectified to provide a DC output with low ripple content.

Figure 12:
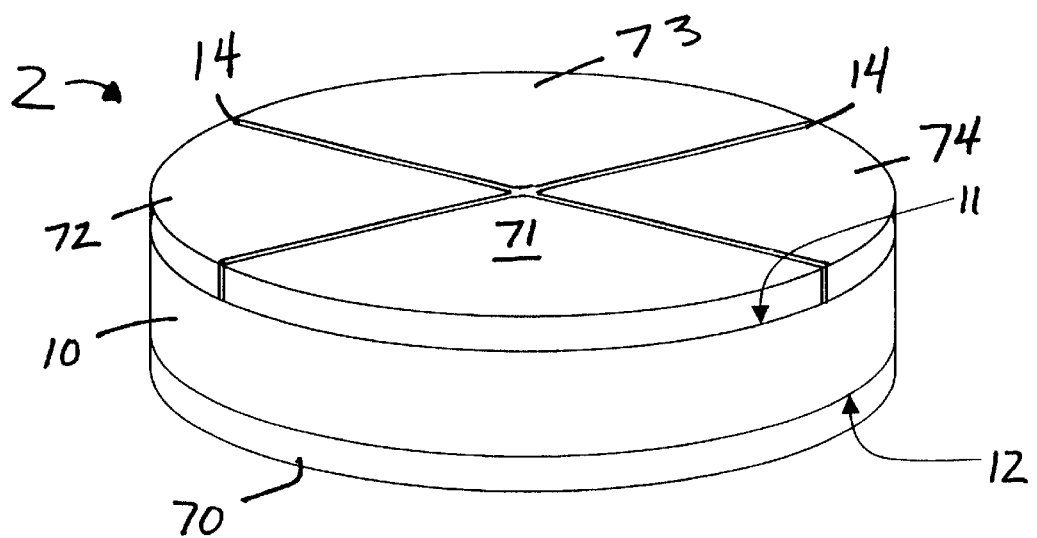
FIG. 12 is a perspective view showing an embodiment of a piezoelectric transformer constructed in accordance with the present invention with a single (common) electrode on one side of the ceramic element.

Referring now to FIG. 12: The output voltage from an electrode pair 65 and 75 may also be applied as a feedback signal in a feedback circuit 80 for the driver circuit 85 which controls the operation of the transformer 1. It will be understood that regardless of the size of the electrode 65, 75 that the output voltage from that segment of the ceramic disk 10 to which the electrode 65, 75 is attached is oscillating at the same frequency as the rest of the transformer 1. The feedback signal from the output electrode 65, 75 is also advantageously insensitive to changes in the load voltage because the feedback electrode 65, 75 is isolated from other electrodes. Thus, a smaller set of electrodes 65, 75 may be used to provide a voltage that matches the frequency of operation of the transformer to a feedback circuit 80 and a resonant driver circuit 85 to control the operation of the transformer 1.

A resonant feedback circuit 85 may be provided which can recover "stored" energy from the transformer. During steady state operation of the circuit 85 and transformer 1, electrical energy applied to an input section 10a of the transformer 1 is either (1) piezoelectrically converted to electrical energy at an output section 10b of the transformer 1, (2) dissipated as heat by the transformer 1, or (3) stored as mechanical energy and a relatively small amount of real capacitance by the transformer 1. In the present invention, a circuit 85 may be provided in which the portion of energy that is stored as mechanical energy by the transformer 1 during one half-cycle of operation of the circuit 85 is nearly entirely converted back into useable electrical energy (at a voltage of an opposite polarity) during the second half-cycle of operation of the circuit 85. The circuit 85 can efficiently accomplish this by subjecting one section of a piezoelectric transformer 1 to a voltage of a first polarity, which in turn causes the input section 10a of the piezoelectric transformer 1 to deform, which in turn causes the adjacent sections 10b and 10f of the piezoelectric transformer 1 to deform, and which in turn generates an output voltage V2 at the adjacent sections 10b and 10f of the transformer 1. Thus a resonant driver circuit 85 may be provided, together with preferably a single switching transistor, for oscillating the piezoelectric transformer 1 at its resonant frequency while minimizing energy losses (i.e. heat dissipation).

While the above description contains many specificities, these should not be construed as limitations on the scope of the invention, but rather as an exemplification of one preferred embodiment thereof. Many other variations are possible, for example:

While in the preferred embodiment of the invention the ceramic disk 10 is preferably constructed of a PZT ceramic material, other electroactive materials may be used in its place;

The ceramic disk can be piezoelectric, ferroelectric or other electroactive elements;

The various laminate layers (i.e. the ceramic layer, the terminals and the adhesives) may be bonded to each other without sequentially heating and cooling so as to pre-stress the ceramic members;

The electrodes need not cover the entire surface of the ceramic disk.

Only one wedge section may be driven as an input section, and only one wedge section may be used as an output section.

The number of electrodes on one face of the ceramic disk need not equal the number of electrodes on the other face of the ceramic disk.

The need not be an even number of electrodes on each face of the ceramic disk.

The edges of electrodes on opposite faces of the ceramic disk need not be aligned.

One face of the ceramic disk may have only one electrode.

A DC or an AC current may be applied to the input sections.

Accordingly, the scope of the invention should be determined not by the embodiment illustrated, but by the appended claims and their legal equivalents.

I claim:

1. A piezoelectric transformer, comprising:
   a piezoelectric ceramic disk having a radius, a circumference, a thickness and first and second opposing major faces;
   said piezoelectric ceramic disc being polarized in the thickness direction such that upon application of a first voltage across said first and second opposing major faces, said piezoelectric ceramic disk deforms in a radial direction along said radius and in a tangential direction along said circumference;
   at least three electrodes segments, each said electrode segments being in the shape of a sector of said first major face;
   at least one solid dielectric material on said first major face of said piezoelectric ceramic layer between each of said spaced apart electrode segments in said plurality of spaced apart electrode segments; and
   an electrode on said second major face of said piezoelectric ceramic layer;
   said electrode being in opposing relation to said electrode segments on said first major face of said piezoelectric ceramic disk;
   wherein upon application of a first voltage across said electrode and a first electrode segment in opposing relation to said electrode, said piezoelectric ceramic disk deforms in said radial and tangential directions between said electrode and said first electrode segment;
   and wherein said deformation of said piezoelectric ceramic layer between said electrode and said first electrode segment deforms said piezoelectric ceramic layer adjacent said first electrode segment;
   and wherein said deformation of said piezoelectric ceramic layer adjacent said first electrode segment generates a second voltage between said electrode and a second electrode segment in opposing relation to said electrode.

2. The piezoelectric transformer of claim 1,
   wherein said electrode substantially covers said second major face;
   and wherein upon application of a third voltage across said electrode and a third electrode segment in said plurality of electrode segments, said piezoelectric ceramic layer deforms in said radial and tangential directions between said electrode and said third electrode segment;

and wherein said deformation of said piezoelectric ceramic layer between said electrode and said third electrode segment deforms said piezoelectric ceramic layer adjacent said third electrode segment;

and wherein said deformation of said piezoelectric ceramic layer adjacent said third electrode segment generates a fourth voltage between said electrode and an adjacent electrode segment.

3. The piezoelectric transformer of claim 2, further comprising:

means for applying said first voltage and said third voltage simultaneously;

whereby said second voltage and said fourth voltage are generated simultaneously across said electrode and said second electrode segment.

4. The piezoelectric transformer of claim 2, further comprising:

means for applying a fifth voltage across said electrode and a second electrode segment in said plurality of electrode segments; and means for applying said first voltage, said fifth voltage and said third voltage sequentially;

whereby application of said first fifth and third voltages creates a travelling compression wave in said piezoelectric ceramic disk.

5. A piezoelectric transformer, comprising:

a piezoelectric ceramic disk having a radius, a circumference, a thickness and first and second opposing major faces;

said piezoelectric ceramic layer being polarized in the thickness direction such that upon application of a first voltage across said opposing major faces, said piezoelectric ceramic disk deforms in a radial direction along said radius and in a tangential direction along said circumference;

a first plurality of spaced apart electrode segments on said first major face of said piezoelectric ceramic layer; and a second plurality of spaced apart electrode segments on said second major face of said piezoelectric ceramic layer;

a first and a second electrode segment of said first plurality of spaced apart electrode segments being adjacent each other on said first major face;

a third and a fourth electrode segment of said second plurality of spaced apart electrode segments being adjacent each other on said second major face;

a portion of said first electrode segment being in opposing relation to a portion of said third electrode segment;

a portion of said second electrode segment being in opposing relation to a portion of said fourth electrode segment;

wherein application of a first voltage across said first electrode segment and said third electrode segment deforms said piezoelectric ceramic layer in said radial and tangential directions between said first electrode segment and said third electrode segment;

and wherein said deformation of said piezoelectric ceramic layer between said first electrode segment and said third electrode segment deforms said piezoelectric ceramic layer adjacent said first and third electrode segments;

and wherein said deformation of said piezoelectric ceramic layer adjacent said first and third electrode segments generates a second voltage between said second electrode segment and said fourth electrode segment.

6. The piezoelectric transformer of claim 5, further comprising:

at least one solid dielectric material on said first major face of said piezoelectric ceramic layer between each of said spaced apart electrode segments of said first plurality of electrode segments; and at least one solid dielectric material on said second major face of said piezoelectric ceramic layer between each of said spaced apart electrode segments of said second plurality of electrode segments.

7. The piezoelectric transformer of claim 6, wherein said first plurality of spaced apart electrode segments comprises at least three electrode segments each in the shape of a sector of said first major face;

and wherein said second plurality of spaced apart electrode segments comprises at least three electrode segments each in the shape of a sector of said second major face.

8. The piezoelectric transformer of claim 7, further comprising:

means for applying a voltage across said first electrode segment and third electrode segment; and means for applying a voltage across said second electrode segment and fourth electrode segment;

wherein upon application of a third voltage across said second electrode segment and said fourth electrode segment, said piezoelectric ceramic layer deforms in said longitudinal direction between said second electrode segment and said fourth electrode segment;

and wherein said deformation of said piezoelectric ceramic layer between said second electrode segment and said fourth electrode segment deforms said piezoelectric ceramic layer adjacent said second electrode segment and said fourth electrode segment;

and wherein said deformation of said piezoelectric ceramic layer adjacent said second electrode segment and said fourth electrode segment generates a fourth voltage between a fifth electrode segment adjacent said second electrode segment and a sixth electrode segment adjacent said fourth electrode segment.

9. The piezoelectric transformer of claim 8, further comprising:

means for applying said first voltage and said third voltage simultaneously;

whereby said second voltage and said fourth voltage are both generated across said fifth and sixth electrode segments.

10. The piezoelectric transformer of claim 8, further comprising:

means for applying said third voltage to said third electrode segment sequential to applying said first voltage to said first electrode segment.

11. The piezoelectric transformer of claim 10, wherein each of said electrode segments of said first plurality of spaced apart electrode segments is in opposing relation to an electrode segment of said second plurality of spaced apart electrode segments and define a plurality of wedge segments;

said wedge segments comprising a wedge-shaped portion of said ceramic layer having first and second opposing faces and first and second sector-shaped electrode segments on each of said first and second opposing faces.

12. The piezoelectric transformer of claim 11, further comprising:
   means for applying an oscillating voltage of a first frequency sequentially to each of said wedge segments;
   wherein said application of an oscillating voltage sequentially each of said wedge segments generates a travelling wave in said piezoelectric ceramic layer.

13. The piezoelectric transformer of claim 11, wherein said plurality of wedge segments comprises an even number of wedge segments of substantially equal geometry, and further comprising:
   means for applying an oscillating voltage of a second frequency simultaneously to alternate wedge segments;
   wherein said application of an oscillating voltage simultaneously to alternate wedge segments generates a standing wave in said piezoelectric ceramic layer at a resonant frequency.

14. The piezoelectric transformer of claim 13, further comprising:
   a feedback wedge segment comprising a wedge-shaped portion of said ceramic layer having first and second opposing faces and third and fourth sector-shaped electrode segments on each of said first and second opposing faces.

* * * * *